(12) United States Patent
Kim et al.

(10) Patent No.: US 6,534,365 B2
(45) Date of Patent: Mar. 18, 2003

(54) METHOD OF FABRICATING TDMOS DEVICE USING SELF-ALIGN TECHNIQUE

(75) Inventors: Jong Dae Kim, Taejon (KR); Sang Gi Kim, Taejon (KR); Jin Gun Koo, Taejon (KR); Kee Soo Nam, Taejon (KR); Dae Woo Lee, Taejon (KR); Tae Moon Roh, Taejon (KR)

(73) Assignee: Electronics and Telecommunications Research Institute, Taejon (KR)

( * ) Notice: Subject to any disclaimer, the term of this patent is extended or adjusted under 35 U.S.C. 154(b) by 0 days.

(21) Appl. No.: 09/726,910

(22) Filed: Nov. 29, 2000

(65) Prior Publication Data

US 2001/0038121 A1 Nov. 8, 2001

(30) Foreign Application Priority Data

Nov. 29, 1999 (KR) ........................................ 1999-53515

(51) Int. Cl.[7] .............................................. H01L 21/336
(52) U.S. Cl. ........................ 438/270; 438/134; 438/205; 438/231; 438/259
(58) Field of Search ................................ 438/305, 231, 438/134, 205, 270, 259; 257/329, 330

(56) References Cited

U.S. PATENT DOCUMENTS

| | | | |
|---|---|---|---|
| 4,992,390 A | 2/1991 | Chang | 437/42 |
| 5,648,283 A * | 7/1997 | Tsang et al. | 438/138 |
| 5,684,319 A | 11/1997 | Hébert | 257/336 |
| 5,780,353 A | 7/1998 | Omid-Zohoor | 438/433 |
| 5,918,114 A * | 6/1999 | Choi et al. | 438/134 |
| 6,188,104 B1 * | 2/2001 | Choi et al. | 257/330 |
| 6,309,936 B1 * | 10/2001 | Gardner et al. | 438/305 |

OTHER PUBLICATIONS

Osawa et al., "2.5V–Driven Nch 3rd Generation Trench Gate MOSFET," *Proceeding of ISPSD '99*, pp. 209–212, May 1999.

* cited by examiner

*Primary Examiner*—Richard Elms
*Assistant Examiner*—Douglas Menz
(74) *Attorney, Agent, or Firm*—Seed IP Law Group PLLC

(57) ABSTRACT

A method of fabricating a vertical TDMOS power device using sidewall spacers and a self-align technique and a TDMOS power device of the same. The TDMOS is fabricated using only 3 masks and a source is formed using the self-align technique to embody a highly integrated trench formation. During the process, ion implantation of high concentration into the bottom of the trench makes a thick oxide film grow on the bottom and the corner of the gate, so that electrical characteristic, specifically leakage current and breakdown voltage of the device can be improved. Also, process steps can be much decreased to lower process cost, high integration is possible, and reliability of the device can be improved.

3 Claims, 4 Drawing Sheets

FIG. 1
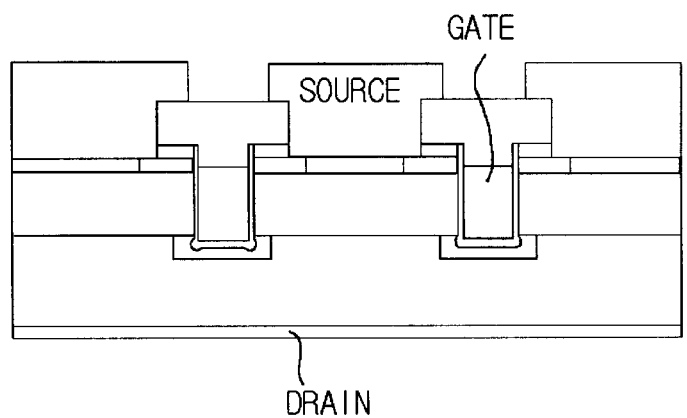
FIG. 2A
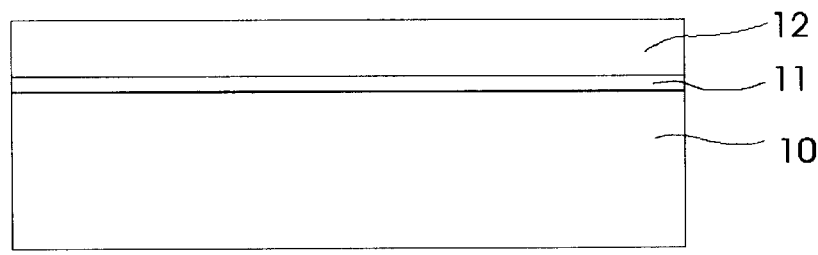
FIG. 2B
FIG. 2C
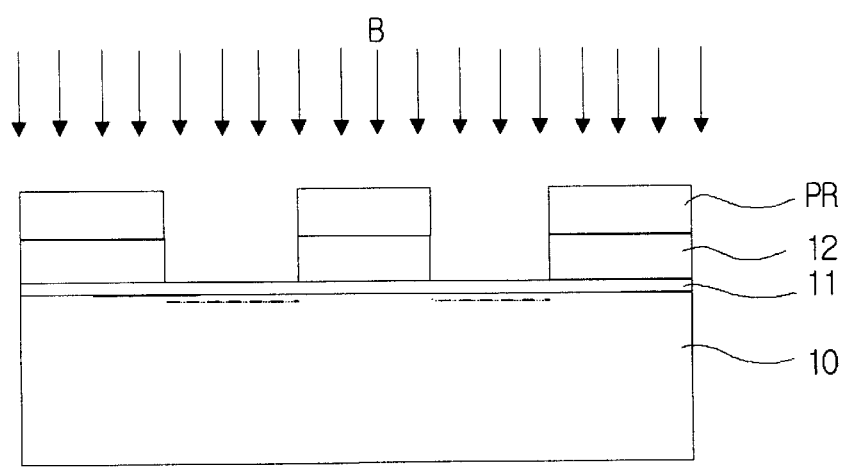

FIG. 2F
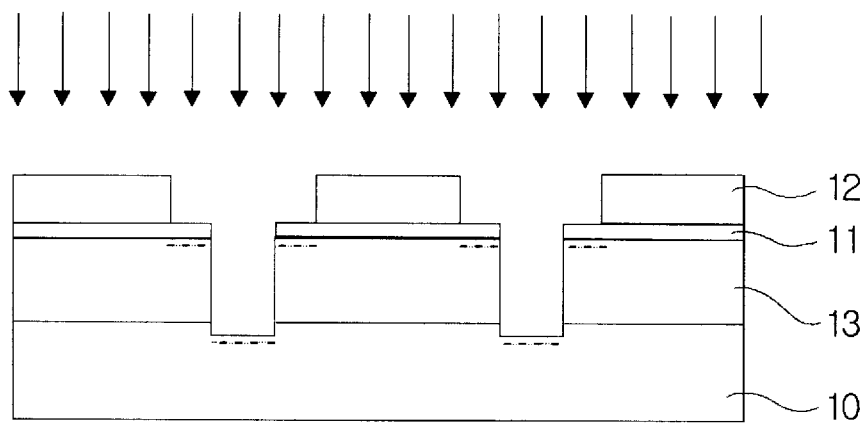
FIG. 2G
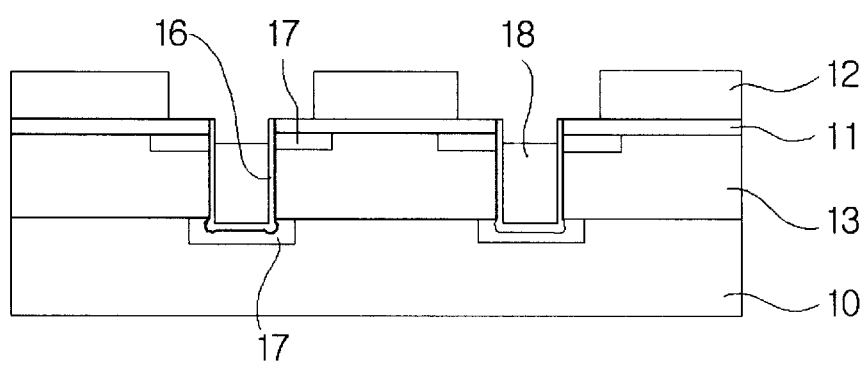
FIG. 2H
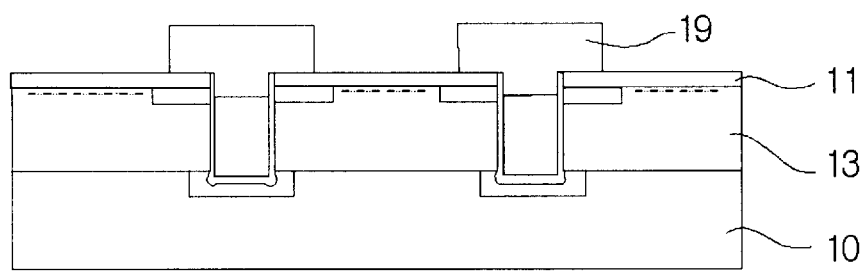
FIG. 2I

METHOD OF FABRICATING TDMOS DEVICE USING SELF-ALIGN TECHNIQUE

TECHNICAL FIELD

The present invention relates to a TDMOS (Trench Double diffused MOS power device and a method of fabricating a vertical TDMOS power device. More particularly, the present invention relates to a method of fabricating a vertical TDMOS power device using sidewall spacers and a self-align technique to require only 3 masks and the TDMOS power device of the same.

BACKGROUND OF THE INVENTION

In general, TDMOS is a power device operable with middle voltage and middle current and used in stepping motor, driving IC of FED (Field Emission Display) and the like. Compared with a general DMOS, the TDMOS is fabricated in complex processes using at least four masks. Because cost for masks occupies very large portion of cost for fabricating a semiconductor device, a method of fabricating a semiconductor device is required, which is capable of decreasing the number of masks used in fabrication thereof.

Also, the conventional method of fabricating the TDMOS, it is known, has many problems in leakage current, breakdown voltage and reliability, and thus a method of fabricating a TDMOS device in a more simple and reliable way is required.

SUMMARY OF THE INVENTION

Therefore, the present invention is made in order to solve the problems described above.

An object of the present invention is to provide a method of fabricating a vertical TDMOS power device using a trench sidewall and a self-align technique to require only 3 masks, which is improved in leakage current, breakdown voltage and reliability.

The above objects can be accomplished by a method of fabricating a vertical TDMOS power device, the method comprising steps of: forming a first insulating film pattern on a predetermined region of a substrate of a first conductivity; forming a channel layer by implanting a ion of a second conductivity on said substrate using said first insulating film pattern as a mask and then diffusing said ion of said second conductivity; forming a trench by forming a sidewall spacer on a sidewall of said insulating film pattern and etching said channel layer to expose said substrate of said first conductivity; forming an impurity region in a region of said channel layer adjacent to said trench and in a region of said substrate of said first conductivity under said trench by removing said sidewall spacer and then implanting an ion of said first conductivity using said first insulating film pattern as a mask; forming a gate oxide film on a surface of said trench; forming a gate electrode within said trench; forming a body contact by forming a second insulating film pattern on said gate electrode, removing said first insulating film pattern and then implanting a ion of said second conductivity using said second insulating film as a mask; and forming a metal film for an electrode on said impurity region of said channel layer adjacent to said trench and on said body contact.

It is preferable that an insulating film having an etching selectivity over said first insulating film pattern is formed on a surface of said substrate of said first conductivity.

Also, it is preferable that said sidewall spacer is formed by forming LTO film on the resultant surface and then carrying out an etch-back.

It is more preferable that said LTO film has an etching selectivity over said first insulating film pattern.

It is preferable that in said step of forming said gate oxide film, said gate oxide film on a bottom of said trench is formed thicker than said oxide film on a sidewall of said trench.

Also, it is preferable that the method of fabricating a vertical TDMOS power device further comprises, before said step of forming said gate oxide film, a step of growing an sacrificial oxide film and then removing said sacrificial oxide film, in order to improving a surface state of said trench.

It is preferable that said second insulating film pattern has an etching selectivity over said first insulating film pattern.

Also, the above objects can be accomplished by a vertical TDMOS power device, comprising: a substrate of a first conductivity; a channel layer of a second conductivity formed on said substrate; a trench in a predetermined region of said channel layer; a gate oxide film formed on a surface of said trench; a gate electrode formed on said gate oxide film in said trench; an impurity region of said first conductivity formed on a region of said channel layer adjacent to said trench and on said substrate of said first conductivity under said trench; a body contact of said second conductivity formed on said channel layer, adjacent to said impurity region of said first conductivity; and a metal film connected to said impurity region and said body contact.

It is preferable that, in said gate oxide film on the surface of said trench, said gate oxide film formed on a bottom of said trench is thicker than said oxide film formed on a sidewall of said trench.

BRIEF DESCRIPTION OF THE DRAWINGS

The embodiments of the present invention will be explained with reference to the accompanying drawings, in which:

FIG. 1 is a cross-sectional view of a TDMOS according to a preferred embodiment of the present invention; and FIGS. 2A through 2J are cross-sectional views for illustrating a method of fabricating a TDMOS according to a preferred embodiment of the present invention.

DETAILED DESCRIPTION OF THE INVENTION

The above objects, other objects, features and advantages of the present invention will be better understood from the following description taken in conjunction with the attached drawings.

FIG. 1 is a cross-sectional view of a TDMOS according to a preferred embodiment of the present invention. The TDMOS according to the present invention, when compared with the conventional trench power device, uses sidewall spacers and self-align technique to decrease processing steps and to make high integration possible. Also, in the TDMOS according to the present invention, a thick oxide film is formed on a bottom of the trench to improve device reliability and to prevent a leakage current.

FIGS. 2A through 2J are cross-sectional views for illustrating a method of fabricating a TDMOS according to a preferred embodiment of the present invention.

As shown in FIG. 2A, a first insulating film and a second insulating film are sequentially formed on a substrate of a first conductivity, for example an n-type substrate. It is preferable that the first insulating film is formed by growing an oxide film 11 and the second insulating film is formed by depositing a nitride film 12 with a thickness of about 2000 Å~4000 Å.

Next, as shown in FIG. 2B, a photo-resist (PR) film is formed on the whole surface and then photo/etching steps are carried out using a first mask for formation of a trench to remove a predetermined portion of the nitride film. Then, a second conductivity ions, preferably p-type of boron ions, are implanted into the whole surface with dose of about $1 \sim 5.0 \times 10^{12}/cm^2$.

Figure 2C:
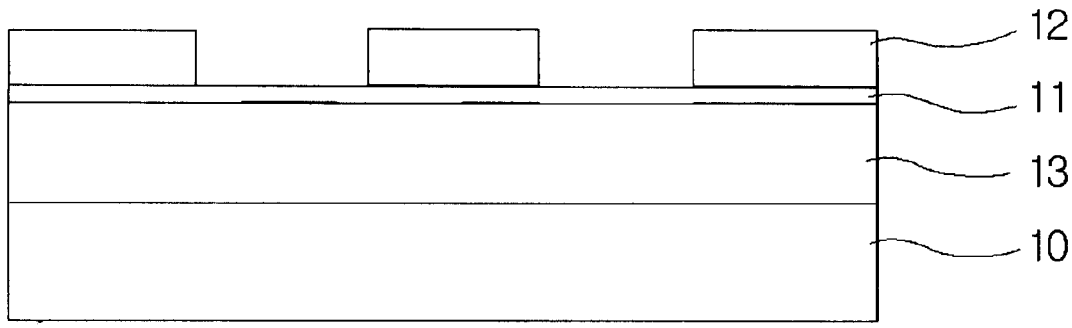

The photo-resist film is removed and then the resultant structure is heat-treated using a drive-in at a temperature of 1150° C. to form a channel layer 13, as shown in FIG. 2C.

Figure 2D:
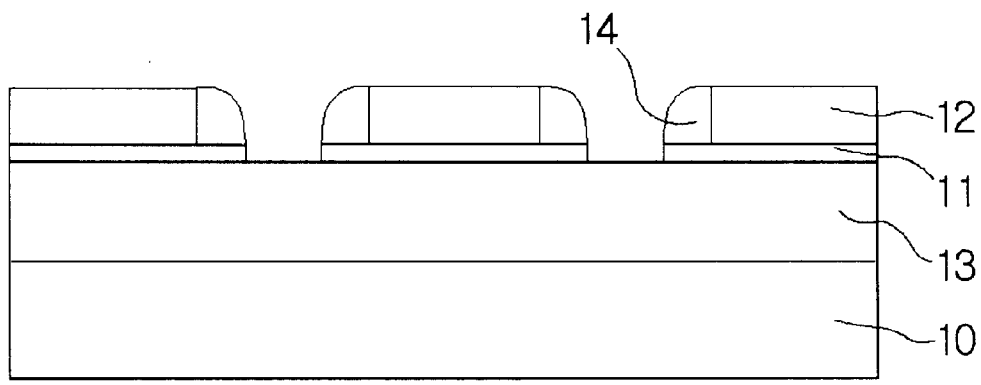

Subsequently, as shown in FIG. 2D, a third insulating film made of LTO (Low Temperature Oxidation) film, more preferably, TEOS (Tetra-ethyl-ortho-silicate) film, is formed on the resultant structure with a thickness of about 2000 Å~4000 Å and then a sidewall spacer 14 made of oxide 14 is formed on sidewalls of the remaining nitride film pattern 12 by etch-back.

Figure 2E:
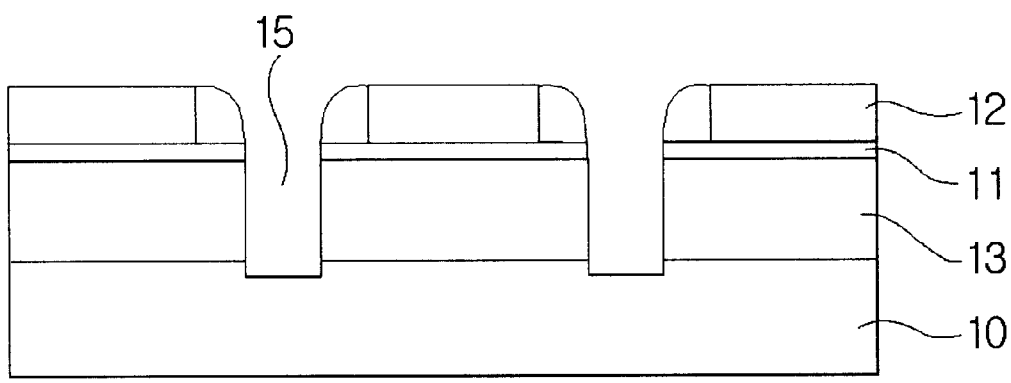

As shown in FIG. 2E, using the nitride film pattern 12 and the sidewall spacer 14 as a mask, a trench 15 is formed by a reactive ion etching (RIE) to expose the substrate.

As shown in FIG. 2F, the sidewall spacer 14 is removed and then an ion of the first conductivity, for example As ion is implanted into the resultant structure with dose of $5.0 \times 10^{15}/cm^2$. At this time, the As ion is implanted into a region of the channel layer adjacent to said trench and into a region of the substrate under the bottom of the trench.

As shown in FIG. 2G, a sacrificial oxide film (not shown) is grown with a thickness of about 500 Å and then removed to cure the surface state of the trench. Next, a gate oxide film 16 is grown on the surface of the trench at temperature of about 900° C.~1100° C. with a thickness of about 500 Å. At the same time as forming of the gate oxide film 16, n-type impurity regions 17 are formed in the region of the channel layer adjacent to said trench and in the region of the substrate under the bottom of the trench. Also, the thickness of the gate oxide film 16 is greater on the bottom of the trench than on the sidewall of the trench, because a concentration of the n-type impurity region under the bottom of the trench is greater.

As described above, a thick gate oxide film formed on the bottom, specifically, on the corner of the bottom of the trench decrease leakage current to improve a breakdown voltage and an electrical characteristic of the device.

Subsequently, a polysilicon is deposited on the whole surface and then using a second mask (not shown) masking a predetermined portion for connecting elements, a gate electrode 18 is formed in inside of the trench by etch-back.

Figure 2I:
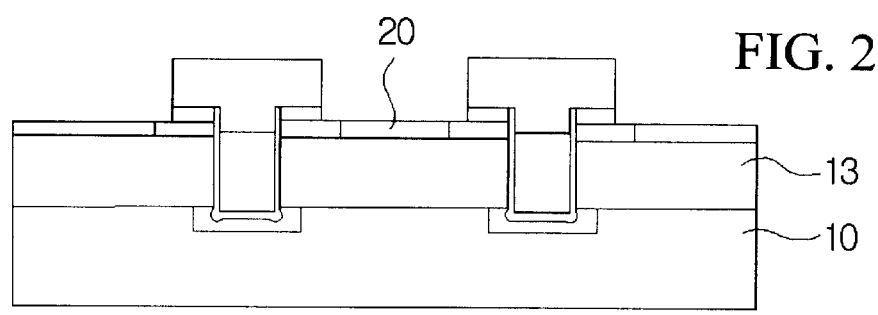

Also, as shown in FIG. 2H, an LTO film 19, preferably $O_3$-TEOS film, of about 2000 Å~4000 Å is deposited on the resultant structure and then etch-back is carried out to expose the nitride film pattern 12. Then, all remaining nitride film pattern 12 is removed. Using the self-align technique, an ion of the second conductivity, for example a p-type boron ion, is implanted into the resultant structure with dose of about $2 \times 10^{15} \sim 3.0 \times 10^{15}/cm^2$ and then heat-treatment is carried out to form a p-type body contact 20, as shown in FIG. 2I.

Figure 2J:
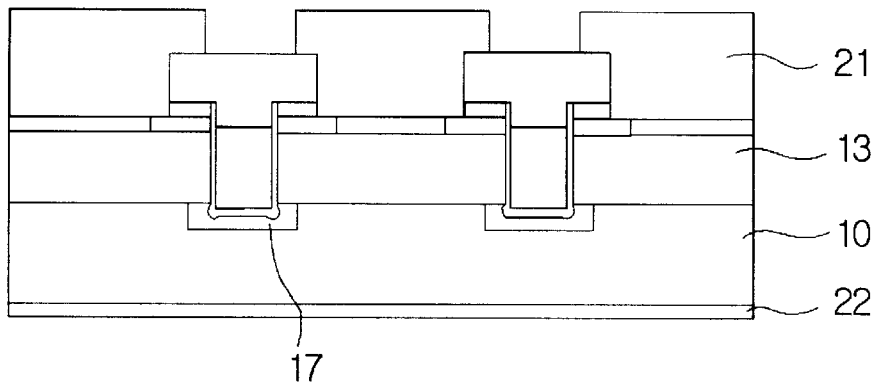

Finally, as shown in FIG. 2J, a metal film 21, for example aluminum, is deposited on the whole surface of the resultant structure and etching is carried out using a third mask (not shown), so that a source electrode and a gate electrode for formation of electrode (not shown), connected to the gate electrode 18 in a predetermined region) can be formed by the self-align technique without formation of a separate contact hole. A metal film, for example aluminum, is formed on a rear surface of the substrate to form a drain electrode 22 connected to the substrate, thereby completing the TDMOS power device.

As described above in detail, according to the present invention, a TDMOS is fabricated using only 3 masks and a source is formed using the self-align technique to embody a highly integrated trench formation. Also, during the process, ion implantation of high concentration into the bottom of the trench makes a thick oxide film grow on the bottom and the corner of the gate, so that electrical characteristic, specifically leakage current and breakdown voltage of the device can be improved.

Therefore, according to the present invention, process steps can be much decreased to lower process cost, high integration is possible, and reliability of the device can be improved because of the thick oxide film on the bottom of the trench.

Although technical spirits of the present invention has been disclosed with reference to the appended drawings and the preferred embodiments of the present invention corresponding to the drawings has been described, descriptions in the present specification are only for illustrative purpose, not for limiting the present invention.

Also, those who are skilled in the art will appreciate that various modifications, additions and substitutions are possible without departing from the scope and spirit of the present invention. Therefore, it should be understood that the present invention is limited only to the accompanying claims and the equivalents thereof, and includes the aforementioned modifications, additions and substitutions.

What is claimed is:

1. A method of fabricating a vertical TDMOS (Trench Double diffused MOS) power device, comprising the steps of:

forming a first insulating film and a second insulating film over a n-type substrate, sequentially;

forming a photo-resist (PR) film over the second insulating film;

removing a predetermined portion of the second insulating film by etching the second insulating film using a first mask, and implanting p-type ions into an entire surface of a resultant structure;

forming a channel layer beneath the first insulating film by heat treating after removing the PR film;

forming a sidewall spacer on the side wall of the remaining second insulating film;

forming a trench by etching the channel layer using both of the remaining second insulating film and the sidewall spacer as a mask to expose the substrate;

implanting n-type ions into the entire surface of a resultant structure after removing the side wall spacer;

forming a gate oxide film on the surface of the trench, and forming an n-type impurity region in the region of the channel layer adjacent to the trench and in a region of the substrate under the bottom of the trench by thermal treatment;

forming a gate electrode within said trench by etch-back process using a second mask;

forming an LTO film on the gate electrode and then removing all the remaining second insulating film;

forming a body contact by implanting p-type ions into a region of the first insulating film using the LTO film as a mask and depositing a metal film on an entire surface; and forming a source electrode by etching the metal film using a third mask to expose a center region of the LTO film.

2. The method of fabricating a vertical TDMOS power device according to claim 1, wherein the sidewall spacer is formed by forming LTO (Low Temperature Oxidation) film on the resultant surface and then carrying out an etch-back.

3. The method of fabricating a vertical TDMOS power device according to claim 1, further comprising, before forming the gate oxide film, a step of growing an sacrificial oxide film and removing said sacrificial oxide film, in order to improve a surface state of said trench.

* * * * *